(12) United States Patent
Preusse et al.

(10) Patent No.: US 7,985,329 B2
(45) Date of Patent: Jul. 26, 2011

(54) TECHNIQUE FOR ELECTROCHEMICALLY DEPOSITING AN ALLOY HAVING A CHEMICAL ORDER

(75) Inventors: Axel Preusse, Radebeul (DE); Gerd Marxsen, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 1667 days.

(21) Appl. No.: 11/257,735

(22) Filed: Oct. 25, 2005

(65) Prior Publication Data

US 2006/0219565 A1  Oct. 5, 2006

(30) Foreign Application Priority Data

Mar. 31, 2005  (DE) .......... 10 2005 014 748

(51) Int. Cl.
 *C25D 5/10* (2006.01)
(52) U.S. Cl. ............ 205/176; 204/230.2; 205/102; 205/104; 205/170
(58) Field of Classification Search .......... 205/104, 205/176, 182
 See application file for complete search history.

(56) References Cited

U.S. PATENT DOCUMENTS

| | | | | |
|---|---|---|---|---|
| 1,920,964 | A * | 8/1933 | Burns | 205/256 |
| 6,159,847 | A * | 12/2000 | Havemann et al. | 438/652 |
| 6,344,123 | B1 * | 2/2002 | Bhatnagar | 205/96 |
| 6,547,946 | B2 * | 4/2003 | Meltzer et al. | 205/181 |
| 6,649,034 | B1 * | 11/2003 | Tran et al. | 204/237 |
| 6,805,786 | B2 * | 10/2004 | Tran et al. | 205/91 |
| 2003/0089986 | A1 | 5/2003 | Gilkes et al. | 257/751 |
| 2003/0134142 | A1 * | 7/2003 | Ivey et al. | 428/646 |
| 2006/0027460 | A1 * | 2/2006 | Chang et al. | 205/104 |

FOREIGN PATENT DOCUMENTS

| | | |
|---|---|---|
| EP | 1 264 918 A1 | 12/2002 |
| EP | 1 403 401 A2 | 3/2004 |
| GB | 1 283 024 | 7/1972 |
| JP | 07197299 A | 8/1995 |
| WO | WO 02/29875 A2 | 4/2002 |
| WO | WO 0245142 A2 * | 6/2002 |
| WO | WO 02/055762 A2 | 7/2002 |

OTHER PUBLICATIONS

"Electrodeposition of Compositionally Modulated Alloys by a Electrodeposition-Displacement Reaction Method" by S. Roy, in Surface and Coatings Technology 105, pp. 202-205 (1998).*

"Electrodeposition of Copper-Tin Alloy Thin Films for Microelectronic Applications" by Padhi et al., in Electrochimica Acta 48, pp. 935-943 (2003).*

* cited by examiner

*Primary Examiner* — Harry D Wilkins, III
*Assistant Examiner* — Bryan D. Ripa
(74) *Attorney, Agent, or Firm* — Williams, Morgan & Amerson, P.C.

(57) ABSTRACT

By providing two or more consumable electrodes within a single reactor vessel, an alloy having a high degree of chemical ordering may be deposited in situ in that the current flows of the individual consumable electrodes are controlled to obtain a substantially layered deposition of the two or more metals. Hence, especially in copper-based metallization layers, the advantage of enhanced resistance against electromigration offered by alloys may be achieved without unduly reducing the overall conductivity.

15 Claims, 4 Drawing Sheets

TECHNIQUE FOR ELECTROCHEMICALLY DEPOSITING AN ALLOY HAVING A CHEMICAL ORDER

BACKGROUND OF THE INVENTION

1. Field of the Invention

Generally, the present invention relates to the formation of microstructures, such as advanced integrated circuits, and, more particularly, to the formation of conductive structures, such as metal lines in metallization layers of integrated circuits.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per unit die area. The reduced cross-sectional area of the interconnect lines, possibly in combination with an increase of the static power consumption of extremely scaled transistor elements, may require a plurality of stacked metallization layers to meet the requirements in view of a tolerable current density in the metal lines.

Advanced integrated circuits, including transistor elements having a critical dimension of 0.13 μm and even less, may, however, require significantly increased current densities in the individual interconnect lines, despite the provision of a relatively large number of metallization layers, owing to the significant number of circuit elements per unit area. Operating the interconnect lines at elevated current densities, however, may entail a plurality of problems related to stress-induced line degradation, which may finally lead to a premature failure of the integrated circuit. One prominent phenomenon in this respect is the current-induced material transportation in metal lines, also referred to as "electromigration," which may lead to the formation of voids within and hillocks next to the metal line, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.18 μm or less, may require significantly reduced cross-sectional areas of the metal lines and, thus, increased current densities, which may render aluminum less attractive for the formation of metallization layers.

Consequently, aluminum is increasingly being replaced by copper because it exhibits a significantly lower resistivity and because it exhibits a significant resilience to electromigration effects at considerably higher current densities as compared to aluminum. The introduction of copper into the fabrication of microstructures and integrated circuits creates a plurality of severe problems due to copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper lines are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitances of neighboring copper lines. Hence, a thin conductive barrier layer that also imparts the required mechanical stability to the copper is formed to separate the bulk copper from the surrounding dielectric material, and only a thin silicon nitride or silicon carbide or silicon carbon nitride layer in the form of a capping layer is frequently used in copper-based metallization layers. Currently, tantalum, titanium, tungsten and their compounds, with nitrogen and silicon and the like, are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not readily be deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from approximately 0.1 μm or less to several μm. Although electrochemical deposition processes for copper are well established in the field of electronic circuit board fabrication, a substantially void-free filling of high aspect ratio vias is an extremely complex and challenging task, wherein the characteristics of the finally obtained copper metal line significantly depend on process parameters, materials and geometry of the structure of interest. Since the geometry of interconnect structures is determined by the design requirements and may, therefore, not be significantly altered for a given microstructure, it is of great importance to estimate and control the impact of materials, such as conductive and nonconductive barrier layers, of the copper microstructure and their mutual interaction on the characteristics of the interconnect structure to insure both high yield and the required product reliability.

Accordingly, a great deal of effort has been made in investigating the degradation of copper lines, especially in view of electromigration, in order to find new materials and process strategies for forming copper metal lines, as increasingly tighter constraints are imposed with respect to the electromigration characteristics of copper lines with the continuous shrinkage of feature sizes in advanced devices. Although the exact mechanism of electromigration in copper lines is still not quite fully understood, it turns out that voids positioned in and on sidewalls and interfaces, large bulk voids and residuals at the via bottom may have a significant impact on the electromigration behavior. Empirical research results indicate that the degree of electromigration may frequently depend on the material composition of the metal. That is, it is often observed that an alloy may exhibit a significantly reduced degree of electromigration compared to the pure metal, assuming that the remaining conditions are identical. However, employing an alloy, such as a copper alloy, instead of pure copper may compromise the conductivity of the metal line and therefore adversely affect device performance. With ever-decreasing feature sizes, the influence of the reduced mean free path length of electrons for inelastic scattering is gaining importance with respect to the overall conductivity. Consequently, by forming a specific texture or crystallographic order in the alloy, thereby increasing the mean free path length of the electrons, the reduction in conductivity may be reduced compared to arbitrarily formed alloys, while the anisotropy created by the ordered structure may still enhance the resistance against electromigration. However, current deposition techniques, especially electrochemical deposition techniques, used for mass production of highly advanced metallization layers may suffer from insufficient process flexibility with respect to alloy deposition.

Therefore, a need exists for an enhanced electrochemical deposition technique that provides enhanced flexibility in forming an alloy in vias and trenches of metallization layers.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the electrochemical deposition of two or more metals on a substrate surface, wherein the two or more metals exhibit a high degree of chemical ordering, thereby providing the potential for forming alloys in metal lines of semiconductors having a high resistance against electromigration while substantially avoiding undue degradation of conductivity.

According to one illustrative embodiment of the present invention, a method comprises contacting a surface to be plated with an electrolyte, wherein the electrolyte is in contact with a first consumable electrode comprised of a first metal and with a second consumable electrode comprised of a second metal that is different from the first metal. Moreover, a first current flow is established between the first consumable electrode and the surface via the electrolyte. Additionally, a second current flow is established between the second consumable electrode and the surface via the electrolyte.

In accordance with still another illustrative embodiment of the present invention, a method comprises electrochemically depositing a first layer of a first metal and a second layer of a second metal above an insulating layer having formed therein trenches of a metallization layer of a semiconductor device. Thereby, the first and second metal layers are deposited in situ using a single electrolyte solution.

According to yet another illustrative embodiment of the present invention, a deposition tool comprises a reactor vessel configured to contain a specified electrolyte. The deposition tool further comprises a first consumable electrode comprised of a first metal, wherein the first consumable electrode is located within the reactor vessel. The tool further comprises a second consumable electrode comprised of a second metal other than the first metal, wherein the second consumable electrode is located within the reactor vessel so as to be electrically insulated from the first consumable electrode. Furthermore, a first current source is provided and is electrically connected to the first consumable electrode and a second current source is electrically connected to the second consumable electrode.

BRIEF DESCRIPTION OF THE DRAWINGS

The invention may be understood by reference to the following description taken in conjunction with the accompanying drawings, in which like reference numerals identify like elements, and in which:

FIG. 1$a$ schematically shows a cross-sectional view of a metallization layer of an advanced semiconductor device including a chemically ordered alloy in an interconnect structure;

FIG. 1$b$ schematically shows an enlarged view of an atomic monolayer forming an alloy stack;

FIG. 2$a$ schematically shows a deposition tool for the electrochemical deposition of an alloy so as to have a specified anisotropy or chemical ordering;

FIGS. 2$b$-2$d$ schematically show plan views of exemplary electrode assemblies including consumable electrode portions in accordance with illustrative embodiments;

FIG. 2$e$ schematically shows illustrative waveforms for controlling the operation of the deposition tool shown in FIG. 2$a$; and FIG. 2$f$ schematically shows an electrode assembly including a substantially inert shield electrode located above an electrode assembly including two or more consumable electrodes of different materials.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates the electrochemical deposition of two or more metals in situ to produce a specified desired anisotropy in the metal layer deposited. Hereby, the term "in situ" refers to a process in which the two or more different metals may be deposited in a single deposition sequence in a timely sequential manner or in any timely overlapping manner, wherein the substrate surface to be plated is both within a single reactor vessel and is exposed to a single electrolyte or electrolyte flow without requiring a replacement of the electrolyte and of other components of the deposition tool, except for replenishing a certain amount of bath ingredients. Although the present invention should not be restricted to the following considerations, it is assumed that, in particular, the problem of increased electromigration in highly scaled metal lines of semiconductor devices and other microstructures may be significantly relaxed in that a certain degree of chemical ordering or anisotropy is introduced into the metal line. For instance, it has been found that copper-based metal lines may exhibit a significantly reduced tendency for electromigration when pure copper is replaced by an alloy such as copper nickel (CuNi), copper gold (CuAu), copper palladium (CuPd), and the like. By providing the alloy in a form that exhibits anisotropic properties, both an enhanced resistance against electromigration and an acceptable behavior with respect to the line conductivity may be achieved, wherein the present invention provides a technique that enables the achievement of the above objectives by an electrochemical deposition, that is, by electroplating, which has proven to be a viable technique for manufacturing copper-based metallization layers in highly advanced semiconductor devices. Consequently, by improving the well-approved electrochemical deposition, in particular, of copper-based alloys, by providing two or more consumable electrodes with an appropriate voltage and current control scheme during a single deposition process, a high throughput process is provided without requiring expensive and time-consuming CVD techniques, such as atomic layer deposition (ALD).

It should be noted that the present invention is particularly advantageous in the context of copper-based interconnect structures since these structures will preferably be used in advanced microstructures, such as fast microprocessors, high-end storage chips and the like, wherein especially the problem of electromigration may significantly impact further developments in fabricating sophisticated integrated circuits. The principles of the present invention may, however, be readily applied to any microstructure of interest in which stress-induced material transport phenomena may significantly influence the operation and the reliability of the microstructure. The present invention should, therefore, not be considered as being restricted to copper-based interconnect structures unless such restrictions are explicitly set forth in the appended claims.

Figure 1A:
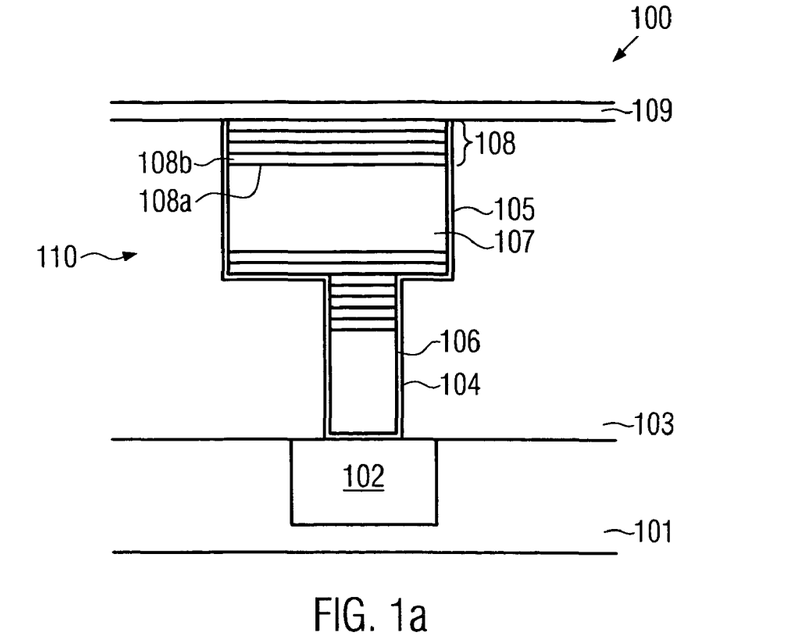

With reference to the accompanying drawings, further illustrative embodiments of the present invention will now be described in more detail. FIG. 1a schematically shows a microstructure 100 which may represent a semiconductor device of an advanced integrated circuit. The microstructure 100 may comprise a substrate 101 which may represent any appropriate substrate for the production of semiconductor devices, such as silicon substrates, silicon-on-insulator (SOI) substrates, silicon-based substrates including regions of different crystalline orientations and/or different semiconductor material compositions and the like. The substrate 101 may include one or more device layers in which specific features of the microstructure 100 are formed, such as circuit elements in the form of transistors, capacitors, and the like. For convenience, any such features are not shown.

The substrate 101 may comprise a region 102 that is to be contacted by a highly conductive interconnect structure 110, wherein the region 102 may represent a metal line, a contact region of a circuit element, and the like. The interconnect structure 110 may be formed within a dielectric layer 103 which may be comprised of any appropriate material, such as silicon dioxide, silicon nitride, any low-k dielectric material, and the like. The interconnect structure 110 may comprise a trench 105 that is electrically connected to the region 102 by a via 104. The surfaces of the trench 105 and the via 104 may, if a copper-based metallization layer is considered, be coated by a barrier layer 106, which provides the desired mechanical and diffusion blocking effects. For instance, the barrier layer 106 may be comprised of titanium, titanium nitride, tantalum, tantalum nitride, any combinations thereof, and the like, wherein two or more sub-layers may be included in the barrier layer 106. Moreover, the interconnect structure 110 may be filled with an appropriate metal 107, such as copper or any other appropriate material, wherein, in the present invention, at least a second metal is present, at least locally within the interconnect structure 110, so as to preferably form a chemically ordered portion within the trench 105 and/or the via 104.

In this respect, a chemical ordering of an alloy is to be considered as a structure including at least two different metals, wherein a certain anisotropy in the arrangement of the two metals is provided to create a near range structural order. For instance, in one embodiment, an alloy stack 108 may be formed throughout the trench 105 or, as shown in FIG. 1a, at a specified portion thereof such as an upper portion thereof, wherein a plurality of first layers 108a are provided in an alternating fashion with corresponding layers 108b, wherein the layers 108a are substantially comprised of a first metal such as copper while the layers 108b may substantially be comprised of a second metal, such as gold, nickel, palladium, and the like. It should be appreciated that, in actual interconnect structures, the alloy stack 108 may not be comprised of substantially planar sub-layers as is schematically shown in FIG. 1a since the kinetic conditions during the deposition process may lead to certain fluctuations with respect to layer thickness and the form of the layers. For instance, due to a locally varying deposition rate, the layers 108 may exhibit, for example, a bowl shape or the like.

Irrespective of the location and the shape of the individual layers 108a, 108b of the alloy stack 108, a specific chemical ordering is imparted to the stack 108 contrary to the conventional alloys which typically exhibit a substantially isotropic distribution of the various components. It should further be appreciated that, in other embodiments, more than two metals may be provided in a chemical order so as to adapt the overall performance of the interconnect structure 110 to specific device requirements. For instance, different types of alloys may be provided at different locations within the interconnect structure 110 to specifically adapt local characteristics of the interconnect structure 110. In some embodiments, it is therefore contemplated that, in some areas of the interconnect structure 110, a substantially pure metal, such as copper, is provided, whereas in some portions, such as the upper portion of the trench 105, a copper nickel alloy, for instance in the form of the stack 108, is formed, while in other areas, such as the upper portion of the via 104, a copper, gold, or any other appropriate alloy is formed. In other cases, the layer stack 108 may be formed at any desired position within the interconnect structure 110 and may comprise three or more different types of layers, wherein each type of layer is substantially comprised of a single metal to provide three or more different metals in a chemical order.

The dielectric layer 103 and the interconnect structure 110 may be covered by any appropriate cap layer 109, such as a silicon nitride layer, a silicon dioxide layer, a silicon carbide layer and the like.

The microstructure 100 as shown in FIG. 1a may be formed by the following processes. The substrate 101, having formed therein the region 102 and typically other circuit elements and microstructure features, may be fabricated on the basis of well-established processes including photolithography, implantation, deposition, etch and polishing techniques. Thereafter, the dielectric layer 103 may be formed by well-established chemical vapor deposition (CVD) techniques and/or spin-on techniques. Thereafter, the trench 105 and the via 104 may be patterned into the dielectric layer 103 by well-established photolithography and etch techniques in accordance with the damascene approach. Thereafter, the barrier layer 106 may be deposited, for instance by sputter deposition, CVD, atomic layer deposition (ALD) and the like. Next, a seed layer (not shown) may be deposited by sputter deposition, electroless plating and the like. Thereafter, the electrochemical deposition of the metal 107 is performed on the basis of two or more consumable electrodes within an appropriate electrolyte solution, wherein the current flow from each of the consumable electrodes is established in such a way that a chemically ordered deposition of the metal 107 is achieved as will be described in more detail with reference to FIGS. 2a-2e. For instance, the current flows from the respective consumable electrodes to the surface of the microstructure 100 via an appropriate electrolyte may be controlled so as to obtain the alloy stack 108 as schematically shown in FIG. 1a.

Figure 1B:
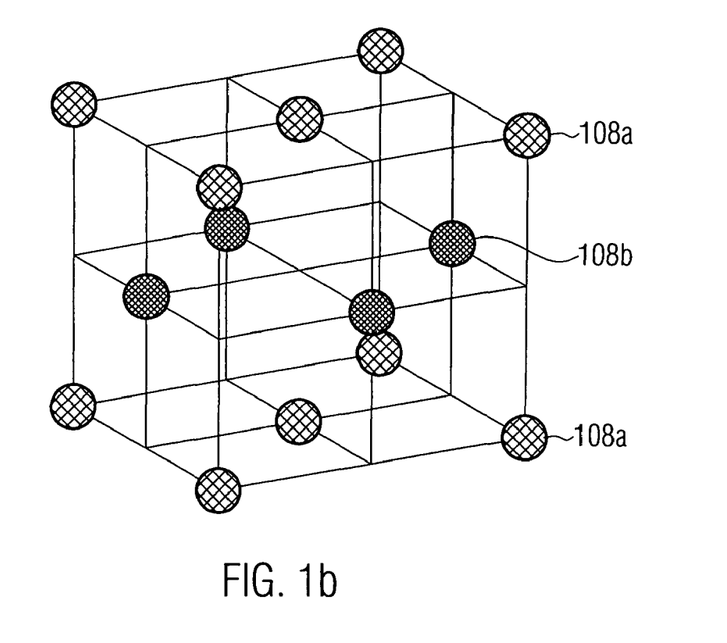

FIG. 1b schematically shows an enlarged view on a microscopic scale of the layer stack 108 in which the stack 108 may represent an ideal layer stack including a plurality of atomic mono layers. For example, the layers 108a may represent layers substantially comprised of copper atoms, while the layer 108b may represent layers substantially comprised of gold atoms. It should be appreciated that FIG. 1b represents an idealized portion of the layer stack 108, since, in an actual layer stack, the individual layers 108a, 108b may represent layers having a thickness in the range of approximately several Angstrom. However, compared to conventional alloys, a high degree of chemical ordering is nevertheless obtained. Depending on process parameters and material characteristics, in some embodiments, a final anneal process may be performed to establish a desired crystallinity within the interconnect structure 110. That is, the grain size of the layers 108a, 108b may be adjusted by heating the layers 108a, 108b above a material dependent activation temperature that allows a reconfiguration of grains. Prior to, or after, the optional anneal process, the cap layer 109 may be formed by well-established techniques, such as plasma enhanced chemical vapor deposition (PECVD). It should be appreciated that, in complex integrated circuits, typically a plurality of metallization layers, i.e., the dielectric layer 103 including the interconnect structure 110, is to be manufactured in accordance with specific device requirements. In highly scaled semiconductor devices, the lateral dimensions of the interconnect structure 110 may be 100 nm and significantly less, thereby increasingly imparting a dominant role to the inelastic scattering of electrons within the metal of the interconnect structure 110 during operation of the microstructure 100. Consequently, the chemical ordering of the different metals within the interconnect structure 110 may reduce inelastic scattering events, while at the same time providing advantages with respect to an increased resistance against electromigration, since it has been confirmed that a plurality of alloys may exhibit a reduced current-induced material transport at significant high current densities compared to the pure metals.

With reference to FIGS. 2a-2e, further illustrative embodiments of the present invention for forming a chemically ordered alloy, such as an alloy stack as exemplified in FIGS. 1a and 1b, by electrochemical deposition will now be described in more detail.

Figure 2A:
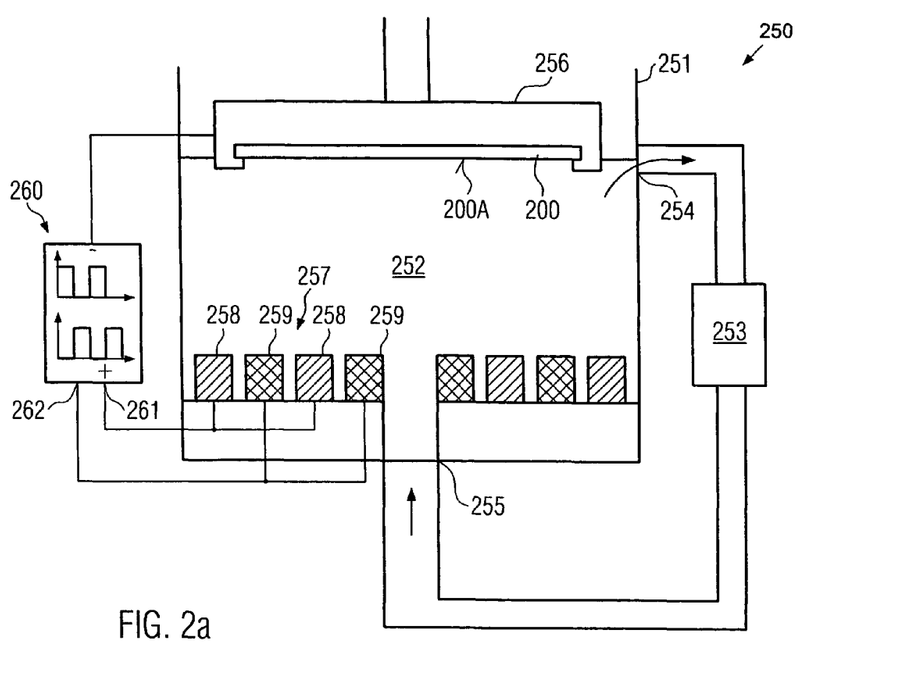

FIG. 2a schematically shows a deposition tool 250 for the electrochemical deposition of metals onto a surface 200a of a substrate 200. The substrate 200 may represent a microstructure that is similar to the microstructure 100 shown and described with reference to FIGS. 1a and 1b. In a particular embodiment, the substrate 200 may comprise, in its surface 200a, a patterned dielectric layer having formed therein trenches of lateral dimensions of as small as approximately 100 nm and even less, wherein the surface 200a may be coated by a thin barrier and/or seed layer, depending on the process requirements and the material to be deposited onto the surface 200a. The substrate 200 is held in place within a reactor vessel 251 by a substrate holder 256. The substrate holder 256 may be configured to receive the substrate 200 and bring it into an operating position as is shown in FIG. 2a. It should be appreciated that the following detailed description refers to the deposition tool 250 as a fountain-type plating system, as this type of reactor arrangement is frequently used in process lines of semiconductor facilities. However, other deposition tool configurations may be used as well in conjunction with the present invention. For instance, any other bath-type reactor geometry, such as tools having implemented a substantially vertical position of the substrate 200, and the like may be used. The reactor vessel 251 is configured to contain a specified type of electrolyte 252, the composition of which may depend on the metals to be deposited and on specific process requirements. For instance, in advanced damascene techniques, a reliable substantially void free deposition of a metal in trenches and via requires a so-called "bottom up" fill behavior which is accomplished by minute amounts of additives so as to precisely adjust the deposition kinetics. The reactor vessel 251 may comprise an outlet 254 for receiving electrolyte and to re-circulate the electrolyte to a storage and/or reworking station 253 which in turn provides refreshed or fresh electrolyte to the reactor vessel 251 via an electrolyte inlet 255. Moreover, an electrode assembly 257 is provided within the reactor vessel 251 and is arranged to be in contact with the electrolyte 252, at least during the operation of the deposition tool 250.

In one illustrative embodiment, the electrode assembly 257 may comprise a first electrode 258 formed of a consumable electrode comprising a first metal to be deposited, such as copper, nickel, gold, palladium and the like. The electrode assembly 257 may further comprise a second electrode 259 including a consumable electrode that comprises a second, different metal such as copper, nickel, gold, palladium and the like. The first and second electrodes 258, 259 are electrically insulated from each other to allow a substantially independent operation of the electrodes. In one particular embodiment, the deposition tool 250 is designed to deposit a copper alloy onto the substrate surface 200a, hence, one of the electrodes 258 and 259 is comprised of copper. It should be appreciated that, in some embodiments, the first and/or second electrodes 258, 259 may be comprised of two or more electrode portions. In the example shown, two electrode portions 258 and two electrode portions 259 are provided in the form of substantially concentric electrode rings. The individual electrode portions may be commonly connected to a control unit 260 which may comprise a first current source 261 and a second current source 262. Thus, in one illustrative embodiment, the individual electrode portions of the first electrode 258 may be commonly connected to the first current source 261, whereas the individual electrode portions of the second electrode 259 may be connected to the second current source 262. In other embodiments, some or all of the individual electrode portions of the first and/or second electrode may be electrically insulated from each other and may be connected to respective individual current sources to provide the potential for more efficiently adjusting the current flow during the operation of the deposition tool 250. It should be further appreciated that more than two electrodes may be provided to enable the deposition of more than two metals in an in situ process.

Figure 2B:
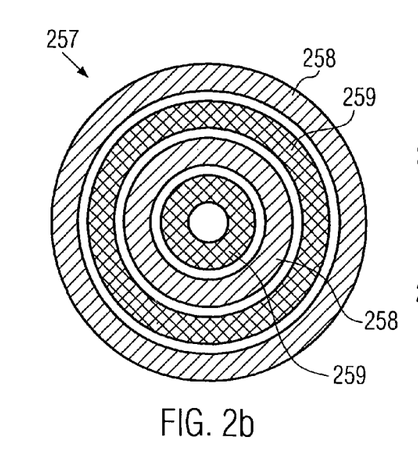

FIG. 2b schematically shows a plan view of the electrode assembly 257 according to one illustrative embodiment. Here, the first electrode 258 is provided in the form of two substantially annular electrode portions, which are arranged in a concentric alternating manner with respective substantially annular electrode portions of the second electrode 259. The concentric arrangement of the first and second electrodes 258, 259, each having two or more electrode portions, may provide a substantially uniform electrical field distribution during the operation of the electrode assembly 257. The electrode assembly 257 may be configured in such a way that individual electrodes, such as the electrodes 258, 259, or even each individual portion of the respective electrodes, may readily be replaced substantially without requiring a dismantling of the remaining parts of the electrode assembly 257. For instance, if the first electrode 258 is comprised of copper, the second electrode 259 may be replaced after a specific process sequence requiring a first alloy component by another alloy component when a different alloy is to be used for a subsequent lot of substrates. The first and second electrodes 258, 259 are electrically insulated from each other so that each electrode may be operated with an individual potential generated by the first and second current sources 261, 262 thereby providing a high degree of flexibility of the operational mode. As previously explained, if an enhanced degree of flexibility is required, some or all of the individual electrode portions may be connected to specifically dedicated current sources.

Figure 2C:
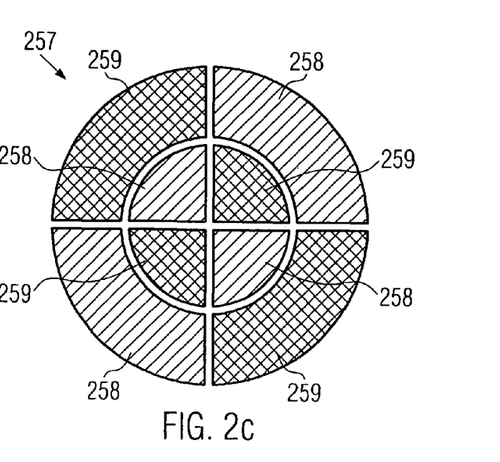

FIG. 2c schematically shows a plan view of the electrode assembly 257 in accordance with another illustrative embodiment. In this embodiment, the first and the second electrodes 258, 259 are comprised of respective electrode portions provided in the form of disc-like segments which are disposed in an alternating fashion to provide a high degree of field uniformity during the operation of the electrode assembly 257. It should be appreciated that the electrode assembly 257 as illustrated in FIGS. 2b and 2c is only of an illustrative nature and any other appropriate configuration may be used. For example, the individual segments of the electrode assembly 257 in FIG. 2c may be divided into even smaller segments, wherein a segment of the first electrode 258 may be disposed adjacent to a segment of the second electrode 259, thereby further "smoothing" any non-uniformity of the global field distribution when operating the electrode assembly 257. In other examples, a grid-like arrangement for the first electrode 258 and the second electrode 259 may be provided to obtain a checker board-like distribution of respective electrode portions, wherein the segments belonging to the first electrode 258 may be connected with each other and the segments belonging to the second electrode 259 may be connected with each other by the grid-like support, which may also serve as a mechanical carrier and electrical connection for the respective metal segments. In other embodiments, the grid-like carriers may be provided individually for each of the first and second electrodes, thereby enabling the removal or replacement of one of the electrodes without affecting the other electrode. For example, a first grid may include copper segments and a second grid may include a desired alloy component, wherein the first and the second grids are stacked on each other so as to expose the copper segments and the other metal segments. Upon change of a process recipe, the upper grid may readily be removed or replaced without requiring the removal of the first grid. It should be appreciated that the above embodiments may readily be applied to an electrode assembly including more than two consumable electrodes.

Figure 2D:
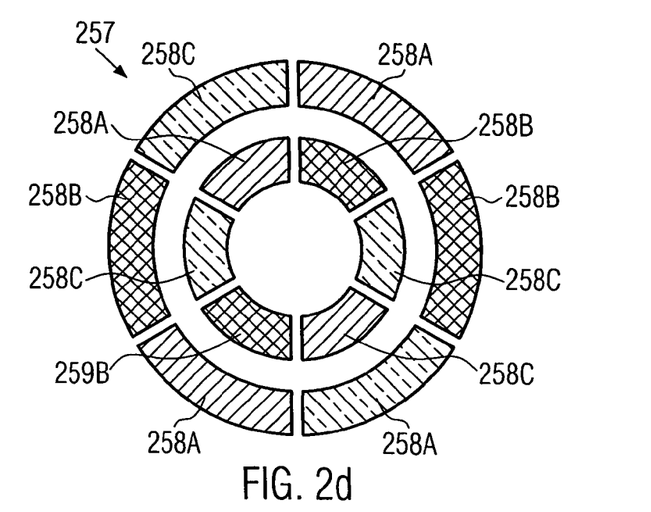

FIG. 2d schematically illustrates an exemplary embodiment of the electrode assembly 257 when comprising three consumable electrodes comprised of different metals. In this embodiment, the three consumable electrodes 258a, 258b and 258c are each provided in the form of ring segments of two substantially concentric rings. Hence, a high degree of field uniformity is still obtained while at the same time a highly complex alloy may be formed in an in situ process. It should be appreciated that the embodiment in FIG. 2d is of illustrative nature only and other arrangements may be used. For example, each of the electrodes 258a, 258b and 258c may be provided in a grid-like configuration to obtain a high degree of uniformity for each of the three individual electrodes 258a, 258b and 258c.

During operation of the deposition tool 250, the electrolyte 252 is supplied to the reactor vessel 251 such that the surface 200a is contacted by the electrolyte 252. Moreover, the control unit 260 may then activate the current sources 261 and 262 in accordance with a specified process recipe. For instance, if the deposition of the first metal, such as copper, is the first to be initiated to create a specified layer thickness of copper on the surface 200a, the control unit 260 may initialize the first current source 261 when it is assumed that the first electrode 258 is comprised of copper to establish a current flow from the first electrode 258 via the electrolyte 252 to the surface 200a, which acts during the deposition as a cathode, while the first electrode 258 represents the anode. It should be appreciated, however, that the first or second current sources may also create a pulsed or even a reverse current flow, depending on the specific process recipe used. Hence, the statement that during deposition the electrode assembly 257 acts as an "anode" is correct for a mean value when the integral of current over time is considered. During the current flow, copper is oxidized at the consumable electrode 258, thereby producing ions in the solution of the electrolyte 252, which are finally reduced and deposited on the surface 200a. When the second electrode 259 is comprised of a metal that is more noble than the metal of the electrode 258, the second electrode 259 may be allowed to float, that is, the electrode 259 may be disconnected from any specific potential. In other cases, the electrode 259 may be maintained at a specified potential to substantially avoid the deposition of any copper thereon or to substantially prevent or at least reduce an electrochemical reaction. When the second electrode 259 is comprised of a metal that is less noble than the metal of the electrode 258, a predefined negative potential may be applied to substantially avoid the deposition of copper on the second electrode 259, or substantially prevent or reduce an electrochemical reaction.

If the deposition of the second metal comprised in the electrode 259 is required, the control unit 260 may disable the first current source 261 and may enable the second current source 262 to initiate the oxidation of the metal of the second electrode 259, thereby creating respective ions in the electrolyte 255 which are then deposited onto the surface 200a. During a certain time period in this phase of the deposition, a transient zone may be created, in which ions of the first metal are still present in the electrolyte and are still being deposited while ions of the second metal are being transferred into the electrolyte. During this phase of the deposition, i.e., when the first electrode 258 is actually disabled so as to stop creating ions of the first metal, the first electrode 258, when being comprised of a less noble metal, may be maintained at a negative potential sufficient to substantially prevent metal ions of the electrode 259 from being deposited on the electrode 258. After a required amount of the second metal is deposited, the deposition process may be continued in accordance with a specific recipe. For example, the second current source 262 may be disabled and the first current source 261 may be enabled to again deposit the first metal, wherein again a transient zone is created as the second metal ions are still being deposited while the metal ions of the first metal are increasingly produced. Thus, these transient zones may have to be taken into consideration when establishing an appropriate control scheme for a specified degree of chemical ordering. In some embodiments, the effective volume of the electrolyte 252 is kept small. Hence, the electrolyte 252 may be provided in an amount of approximately 2-5 times and less of the amount required for actually wetting the surface 200a. Moreover, the electrolyte per se may contain substantially no metal ions so that the electrode assembly 257 acts as the sole metal source.

It should be appreciated that this deposition scheme may be used when a moderately "coarse" degree of chemical ordering is sufficient, i.e., when relatively thick metal layers are deposited with a moderately pronounced transition region therebetween, in which both metals may be present in a more or less non-ordered manner. For a high degree of chemical ordering, it is advantageous to incorporate a "cleaning mechanism" to reduce any deposition phases in which both metals, when the deposition of two metals is considered, or more than two metals are simultaneously present in the electrolyte 252, as will be described in more detail later on.

Figure 2E:
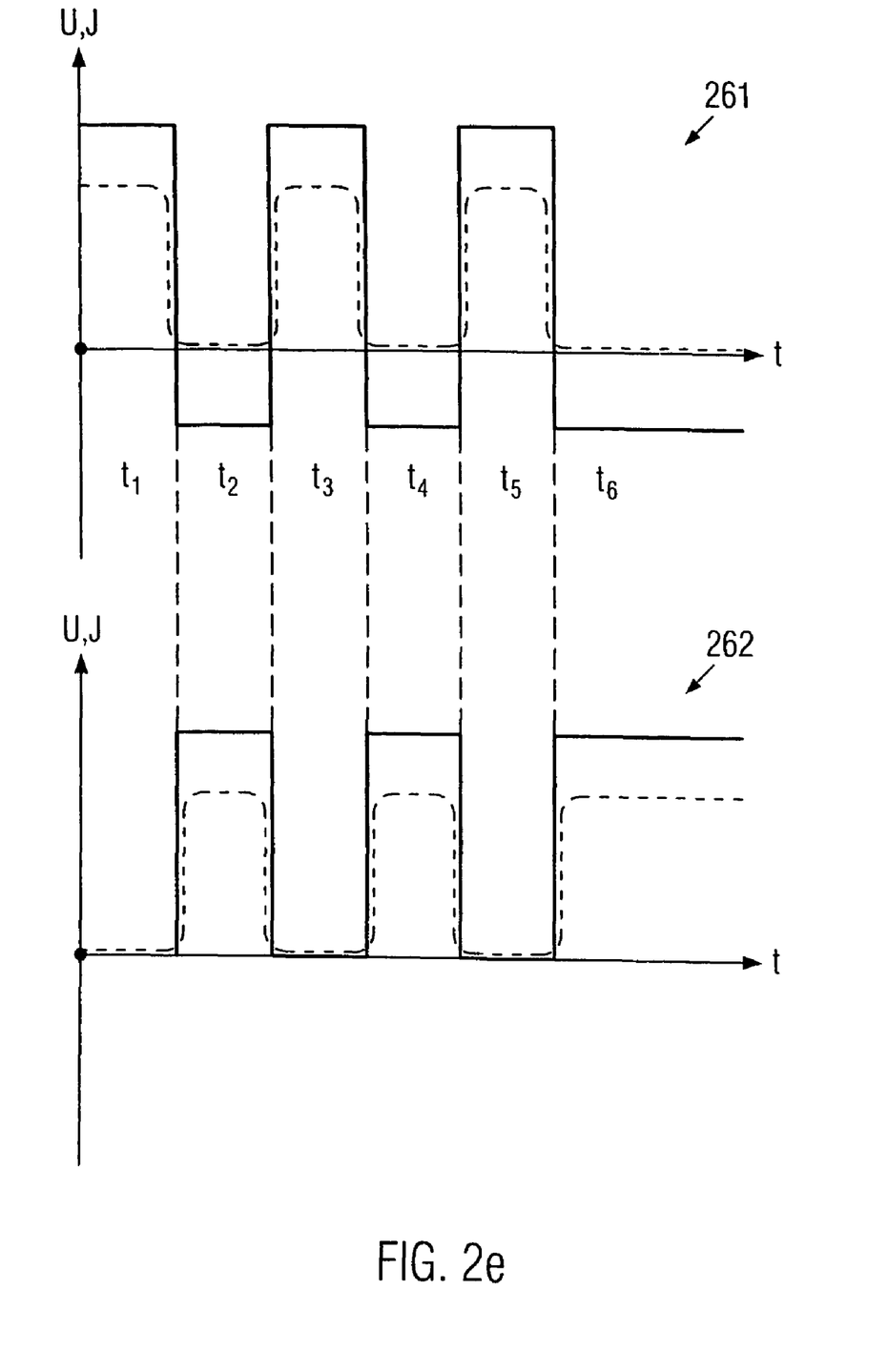

FIG. 2e schematically shows an illustrative time diagram for the voltage and the current of the electrode assembly 257 for forming a chemically ordered alloy. In this illustrative example, it is assumed that the voltage and the current of the first current source 261 is depicted in the upper portion of FIG. 2e and the respective voltage and current progression over time of the second current source 262 is shown in the lower portion of FIG. 2e. In this embodiment, copper may be deposited by enabling the first electrode 258 while gold may be deposited by initiating the second electrode 259. During a first time interval t1, a specific current, indicated by a dashed line, is impressed by applying a specific voltage indicated by the solid line between the electrode 258 and the substrate surface 200a. In a time interval t2, the voltage at the first electrode 258 is reversed to a specified amount to discontinue the current flow and also to substantially avoid any deposition of the second metal, which is now being oxidized and brought into solution, since a specific voltage is applied to the second electrode 259. Similarly, during the time interval t3, the voltage at the second electrode 259 is turned off, for instance, if the metal of the second electrode 259 is more noble than that of the first electrode 258 so that the respective current flow is discontinued and also substantially no material of the first metal is deposited during the current flow initiated by the re-establishment of an appropriate voltage applied to the first electrode 258. Similarly, in the time intervals t4 and t5, respective current flows from the respective electrodes are initiated, while in the time interval t6, the first electrode 258 is disabled for a pronounced time period while the deposition is performed on the basis of the second electrode 259. Thus, by an "interleaved" operation of the first and second electrodes 258, 259, as is shown with reference to the time intervals t1, t2, t3, t4, t5, a "sandwich-like" alloy may be formed on the surface 200a, as is also, for instance, shown in FIGS. 1a and 1b. It should also be appreciated that any other sequences of time intervals may be used to obtain a specific chemical ordering of the alloy under consideration. Moreover, the time intervals t1, t3, t5 representing corresponding deposition phases on the basis of the first electrode 258 and the time intervals t2, t4, t6 representing phases of deposition on the basis of the second electrode 259, may be arranged in any other desired configuration. For instance, respective non-deposition phases may be interposed between respective time intervals of deposition to decrease any minute deposition phases in which both metals may be deposited simultaneously due to the presence of metal ions of both types in the electrolyte. That is, after disabling the first current source 261, for instance after time interval t1, metal ions of the first type may still be present within the electrolyte 252, which may thereafter be deposited simultaneously with metal ions of the second type created during the time interval t2. By inserting a non-deposition phase between the time intervals t1 and t2, which may be, for instance, accomplished by delaying the enabling of the second current source 262 after the disabling of the first current source 261, the metal ions of the first metal may be depleted or diluted to a certain degree since the electrolyte 252 may be permanently re-circulated via the outlet 254, the unit 253 and the inlet 255.

In other embodiments, appropriate voltage and current profiles may be used to minimize the simultaneous presence of both metal ions in the electrolyte 252. For example, in a final phase of the first time interval t1, the voltage may steadily be reduced, thereby also steadily reducing the current flow, hence the concentration of ions of the first metal present during the enabling of the second current source 262 is significantly reduced compared to the voltage-current progression as shown in FIG. 2e. Similarly, the voltage and the current at a final phase of the time interval t2 may be steadily reduced prior to again enabling the first current source 261 in the time interval t3. In a further illustrative embodiment, the electrolyte 252 may comprise one or more complexing agents to maintain the stability of all constituents that are present at one given time in the electrolyte 252. For example, a certain amount of a first complexing agent may be provided that "absorbs" a specified amount of ions of the first metal, while a second complexing agent may be designed to absorb ions of the second metal, thereby substantially preventing the presence of "free" metal ions, when the respective current flow is lowered below the saturation limit of the respective complexing agent prior to disabling the respective electrode.

In still other embodiments, dummy electrodes (not shown) may be used, which may be operated independently from the electrode assembly 257 in non-deposition periods so that, at the respective anode side of the dummy electrodes, an oxygen production or any other oxidation process may occur while the metal ions being present in the electrolyte 252 may be "extracted" at the cathode side of the dummy electrodes. After a sufficient "depletion" of metal ions, a further deposition period with another metal type may be performed. For independently operating the dummy electrodes, one of the current sources 261 or 262 may be temporarily decoupled from the electrode assembly 257 and may be connected to the dummy electrodes by appropriate switches (not shown). Alternatively, a dedicated controllable current source (not shown) for operating the dummy electrodes may be provided.

Thus, by providing the appropriate electrode assembly 257 having two or more consumable electrodes of different materials, the surface 200a may be plated with metal in accordance with a specified chemical ordering. Hence, by appropriately controlling the current sources 261, 262, appropriate amounts of the respective metals may be deposited, wherein the amount may be controlled on the basis of the current ratios as the amount of metal deposited is determined by the Faraday law. Hereby, the control unit 260 may monitor the time integral of each deposition phase, irrespective of the specific current progression in each deposition interval thereby allowing a precise control of the chemical ordering of the alloy under consideration. For instance, a sandwich-like structure may locally be formed within vias and/or trenches by performing a deposition sequence including alternating deposition intervals such as the intervals t1 and t2 in FIG. 2e.

It should be appreciated that the above embodiments may also be applied with electrode assemblies having three or more different consumable electrodes. In these cases, alloy stacks with three or more sub-layers may be formed in a localized manner and/or different alloys with two components may be formed in accordance with device requirements. Hence, a high degree of flexibility in designing an interconnect structure is achieved, since conductivity issues and electromigration aspects may be taken into consideration in a highly localized fashion.

Figure 2F:
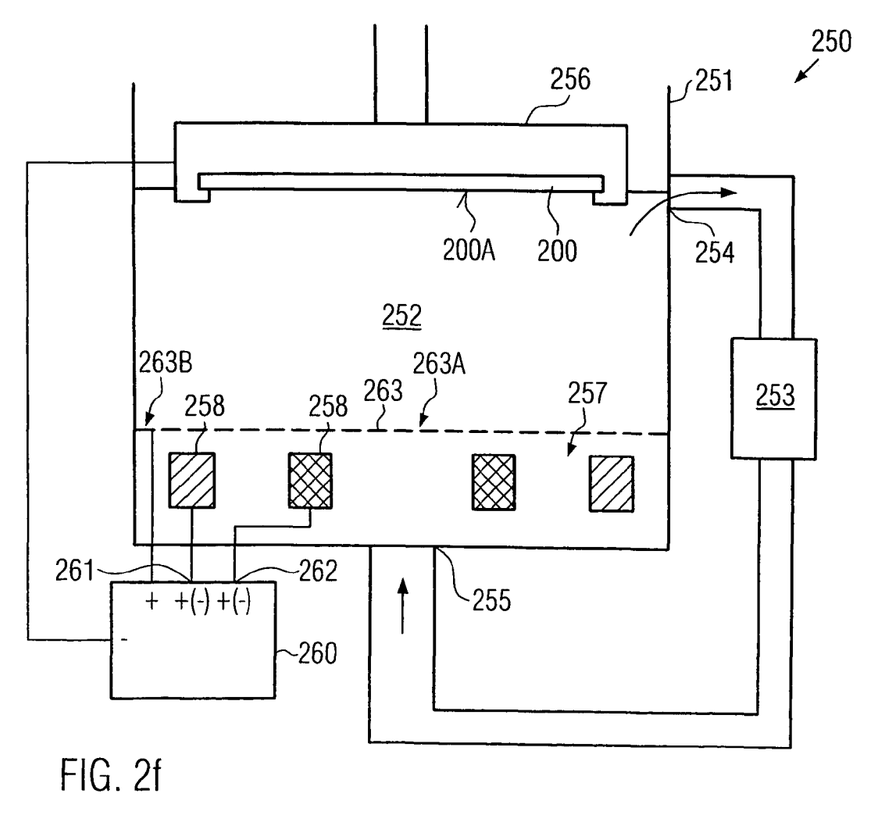

FIG. 2f schematically illustrates the deposition tool 250 in accordance with another illustrative embodiment which may provide enhanced flexibility in controlling respective currents flows from the electrode assembly 257 to the surface 200a. An auxiliary inert electrode 263 is arranged in the vicinity of the electrode assembly 257 including the consumable electrodes 258 and 259. "In the vicinity" is meant to express that the distance of the auxiliary inert electrode 263 to the electrode assembly 257 is significantly less than the distance of the auxiliary inert electrode 263 to the surface 200a. The auxiliary electrode 263 may, for instance, be provided in the form of a grid electrode that is connected to the control unit 260, wherein the auxiliary electrode 263 may be kept at a specified potential in its entirety, or in some embodiments different potentials may be applied to specific portions of the auxiliary electrode 263. For instance, a central portion 263a and a peripheral portion 263b may individually be connectable to the control unit 260. Thus, the auxiliary electrode 263 may be configured to provide a specific distribution of the electrical field and may, in particular, provide a substantially uniform field distribution within the reactor vessel 251.

During the operation of the tool 250, the second electrode 259 may be disabled while a desired voltage may be applied to the first electrode 258 and the surface 200a. Consequently, the specified current flow is established to oxidize metal at the electrode 258 and deposit the metal onto the surface 200a. After a specific time period, which may last from very short periods, yielding a substantially burst-like current flow, to a long deposition period, yielding a moderately continuous current flow, depending on the process requirements, the current source 261 may be disabled and the auxiliary electrode 263 may be set to a specified positive potential to create or maintain the electrical field required for the deposition of the metal ions that are still in solution in the electrolyte 252. Since the auxiliary electrode 263 may preferably be located in close proximity to the electrode assembly 257, the amount of metal ions being present below the electrode 263 is quite small compared to the remaining volume of the reactor vessel 251. After the discontinuation of the current flow due to the reduction and deposition of the metal ions on the substrate surface 200a, the electrode 263 may be switched to a floating potential or any other appropriate potential while the second current source 262 is activated to establish a second current flow for depositing the second metal. Similarly, after a specified time of establishing the second current flow via the electrode 262, the electrode 262 may be disabled and consequently an appropriate potential may be applied to the auxiliary electrode 263 to continue the deposition of the second metal until the electrolyte 252 is substantially depleted from ions of the second metal. Thereafter, if desired, the sequence may be repeated in accordance with process requirements, wherein a high degree of chemical ordering may be achieved since the deposition phases during which two types of metal ions are present in the electrolyte 252 are significantly reduced. Consequently, extremely thin layers of a specific metal may be deposited without requiring a highly complex electrolyte.

As a result, the present invention provides an enhanced technique for electrochemically depositing two or more metals in situ, thereby providing the potential for forming alloys having a high degree of chemical ordering. For this purpose, an electrode assembly comprising two or more consumable electrodes, each comprised of a specific metal, is used in a single reactor vessel, wherein the individual consumable electrodes are electrically insulated from each other so that the individual consumable electrodes may be controlled in accordance with a specified time schedule. In this way, the chemical ordering of a plurality of metals may be tailored during a single deposition process to obtain a high conductivity and a desired resistance against electromigration, especially in copper-based metallization layers of highly scaled microstructures. Moreover, after the deposition of the two or more metals, appropriately designed anneal processes may be performed to further enhance the crystallinity of the deposited metal structure, thereby providing for an even enhanced conductivity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    establishing a predefined time schedule for electrochemically depositing an alloy stack, said alloy stack alternatingly comprising a plurality of first layers of a first metal and a plurality of second layers of a second metal different from said first metal;
    electrochemically depositing said alloy stack in a trench formed in an insulating layer of a metallization layer of a semiconductor device, wherein each of said plurality of first and second metal layers are deposited in situ using a single electrolyte solution.

2. The method of claim 1, wherein a layer of said first metal is deposited during an initial phase of deposition and said alloy stack is formed during a final phase of deposition to provide said alloy stack at an upper portion of said trench.

3. The method of claim 1, further comprising providing a first electrode comprised of said first metal and providing a second electrode comprised of said second metal, said first and second electrodes being in contact with said electrolyte.

4. The method of claim 3, wherein said second metal is less noble than said first metal and wherein said second electrode is maintained at a specified potential when said first layer is deposited.

5. The method of claim 3, wherein depositing said plurality of said first layers comprises establishing a plurality of first current flows between said first electrode and said trench of said metallization layer via said electrolyte, and depositing said plurality of said second layers comprises establishing a plurality of second current flows between said second electrode and said trench of said metallization layer via said electrolyte.

6. The method of claim 5, wherein said plurality of first current flows and said plurality of second current flows are established according to said predefined time schedule.

7. The method of claim 6, wherein at least some of said plurality of first current flows and at least some of said plurality of second current flows are established in an alternating manner.

8. The method of claim 5, further comprising maintaining said second electrode at a specified potential while establishing each of said plurality of said first current flows.

9. The method of claim 1, further comprising depositing a seed layer over said insulating layer prior to contacting said trench with said electrolyte.

10. The method of claim 9, wherein said trench comprises at least one feature having a lateral size of approximately 100 nm or less.

11. The method of claim 1, further comprising annealing said alloy stack to adjust a texture of said first and second metals.

12. A method, comprising:
forming a surface to be plated, said surface comprising a dielectric layer of a semiconductor device having at least one opening formed therein;
depositing a barrier layer above said surface to be plated;
depositing a seed layer above said barrier layer;
contacting said seed layer with an electrolyte, said electrolyte being in contact with a first consumable electrode comprised of a first metal and a second consumable electrode comprised of a second metal other than said first metal;
establishing a plurality of first current flows between said first consumable electrode and said seed layer via said electrolyte;
establishing a plurality of second current flows between said second consumable electrode and said seed layer via said electrolyte;
establishing a predefined time schedule for said plurality of first current flows and said plurality of second current flows, wherein at least some of said pluralities of first and second current flows are established on an alternating basis with respective non-deposition phases therebetween, said non-deposition phases being established by delaying the enabling of a current source for one of said first and second current flows after disabling a current source for the other of said first and second current flows; and
forming an alloy metal stack in said at least one opening, wherein forming said alloy metal stack comprises plating said surface to be plated by depositing alternating layers of said first and second metals on the basis of said predefined time schedule.

13. The method of claim 12, wherein said at least one opening comprises at least one of a trench and a via.

14. A method of forming an interconnect structure, said method comprising:
forming an opening in an insulating layer of a semiconductor device;
contacting the surfaces of said opening with a single electrolyte solution, said single electrolyte solution being in contact with a first electrode comprising a first metal and a second electrode comprising a second metal, said second metal being other than said first metal;
electrochemically depositing a first portion of said interconnect structure in a lower portion of said opening, said first portion of said interconnect structure comprising said first metal; and
electrochemically depositing a second portion of said interconnect structure in an upper portion of said opening, said second portion of said interconnect structure comprising an alloy stack, wherein said alloy stack comprises a plurality of metal layers, said plurality of metal layers alternatingly comprising said first metal and said second metal.

15. The method of claim 14, wherein said opening comprises at least one of a trench and a via.

* * * * *